United States Patent [19]
Ueno

[11] Patent Number: 5,850,364
[45] Date of Patent: Dec. 15, 1998

[54] STATIC SEMICONDUCTOR MEMORY DEVICE WITH PRECHARGING CIRCUITS HAVING SIMILAR CONFIGURATION OF MEMORY CELLS

[75] Inventor: Yoshinori Ueno, Kanagawa, Japan

[73] Assignee: NEC Corporation, Tokyo, Japan

[21] Appl. No.: 957,582

[22] Filed: Oct. 24, 1997

[30] Foreign Application Priority Data

Oct. 24, 1996 [JP] Japan .................................. 8-282306

[51] Int. Cl.$^6$ ........................................................ G11C 7/00
[52] U.S. Cl. ........................ 365/203; 365/154; 365/230.03
[58] Field of Search ........................... 365/154, 203, 365/230.03

[56] References Cited

U.S. PATENT DOCUMENTS 5,570,312 10/1996 Fu ............................................ 365/154
5,684,745 11/1997 Kim et al. ............................ 365/189.11

Primary Examiner—David Nelms
Assistant Examiner—Andrew Q. Tran
Attorney, Agent, or Firm—Foley & Lardner

[57] ABSTRACT

In a static semiconductor memory device including a plurality of word lines, a plurality of bit line pairs, at lest one precharging line, a plurality of static memory cells connected to one of the word lines and one of the bit line pairs, and a plurality of precharging circuits, connected to the precharging line and one of the bit line pairs, thus charging the one of the bit line pairs, each of the precharging circuits has a similar configuration to one of the static memory cells.

5 Claims, 17 Drawing Sheets

N-TYPE IMPURITY DIFFUSION REGION

N-TYPE IMPURITY DIFFUSION REGION 5,850,364

STATIC SEMICONDUCTOR MEMORY DEVICE WITH PRECHARGING CIRCUITS HAVING SIMILAR CONFIGURATION OF MEMORY CELLS

BACKGROUND OF THE INVENTION

Field of the Invention

The present invention relates to a semiconductor device and, more particularly, to a static random access memory (SRAM) device.

A prior art SRAM device includes a plurality of word lines, a plurality of bit line pairs, at least one precharging line, a plurality of static memory cells connected to one of the word lines and one of the bit line pairs, and a plurality of precharging circuits connected to the precharging line and one of the bit line pairs, thus charging the one of the bit line pairs. In this device, the density of elements in the memory cell area of the static memory cells is much higher than that in the precharging circuit. This degrades the operation characteristics of the device. For avoiding the degration of the operation characteristics, inactive dummy memory cells having the same configuration as the memory cells are inserted between the memory cell area and the precharging circuit. This will be explained later in detail.

In the above-described prior art SRAM device, however, since the inactive dummy memory cells are necessary, the integration of the device is reduced.

SUMMARY OF THE INVENTION

It is an object of the present invention to enhance the integration of an SRAM device.

According to the present invention, in a static semiconductor memory device including a plurality of word lines, a plurality of bit line pairs, at least one precharging line, and a plurality of static memory cells connected to one of the word lines and one of the bit line pairs, and a plurality of precharging circuits, connected to the precharging line and one of the bit line pairs, thus charging the one of the bit line pairs, each of the precharging circuits has a configuration similar to one of the static memory cells.

Since the precharging circuits also serve as inactive dummy memory cells, such inactive dummy memory cells can be omitted.

BRIEF DESCRIPTION OF THE DRAWINGS

The present invention will be more clearly understood from the description as set forth below, in comparison with the prior art, with reference to the accompanying drawings, wherein.

FIG, 1 is a layout diagram illustrating a first prior art SRAM device.

DESCRIPTION OF THE PREFERRED EMBODIMENTS

Before the description of the preferred embodiments, prior art SRAM devices will be explained with reference to FIGS. 1, 2, 3, 4A, 4B, 4C, 4D, 5 and 6.

Figure 1:
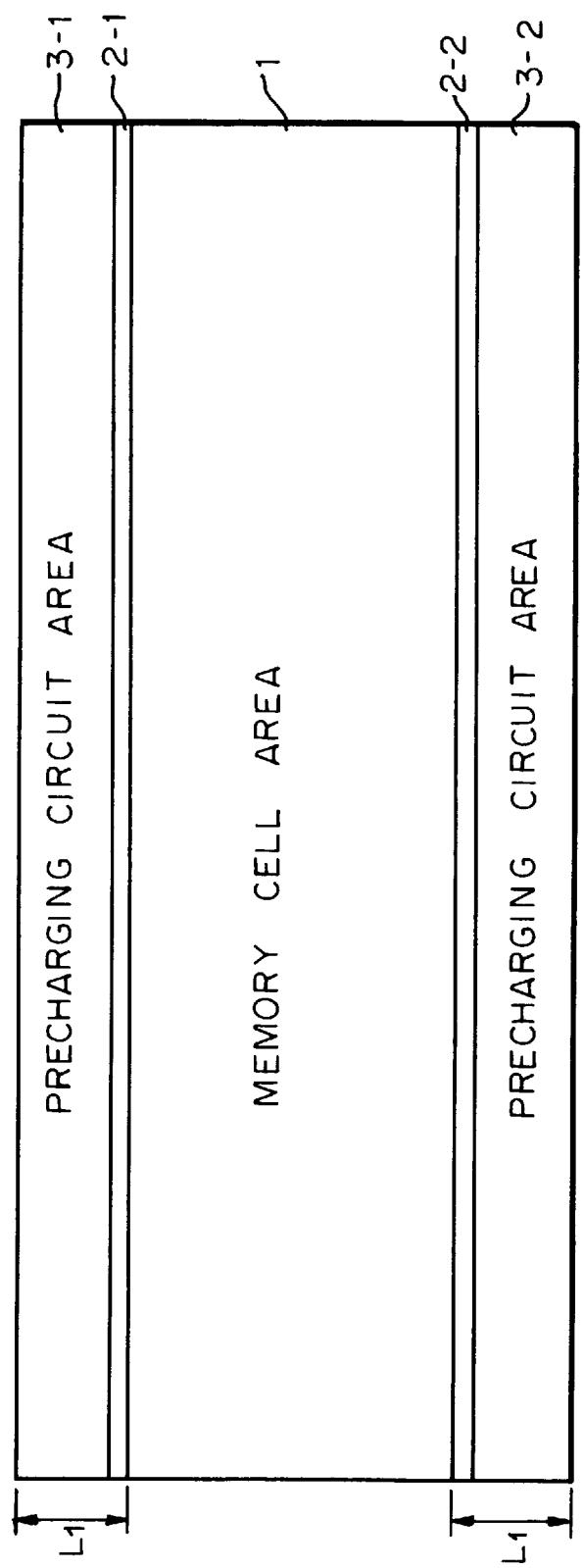

In FIG. 1, which is a layout diagram illustrating a first prior art SRAM device, reference numeral 1 designates a memory cell area, 2-1 and 2-2 designate dummy memory cell areas, and 3-1 and 3-2 designate precharging circuit areas.

Figure 2:
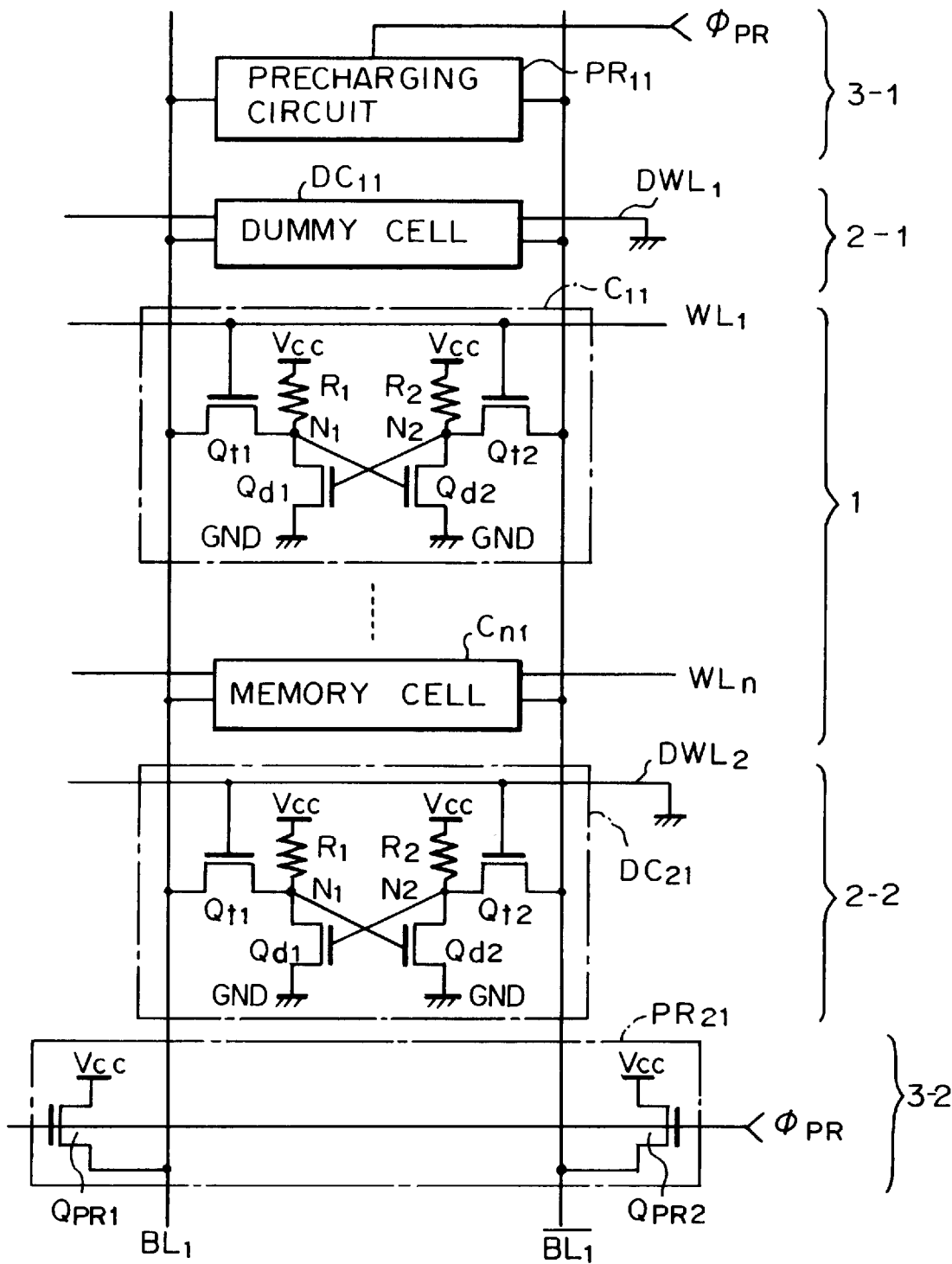
FIG. 2 is a circuit diagram of one column of the device of FIG. 1.

In FIG. 2, which is a circuit diagram of one column of the device of FIG. 1, the memory cell area 1 includes memory cells $C_{11}$ to $C_{n1}$ each connected to one of word lines $WL_1$ to $W_n$ and complementary bit lines $BL_1$ and $\overline{BL_1}$. Also, the dummy memory cell area 2-1 (2-2) includes one dummy memory cell $DC_{11}$ ($DC_{21}$) connected to one dummy word line $DWL_1$ ($DWL_2$) and the bit lines $BL_1$ and $\overline{BL_1}$. Further, (the precharging circuit area 3-1 (3-2) includes one precharging circuit $PR_{11}$ ($PR_{21}$) connected to the bit lines $BL_1$ and $\overline{BL_1}$. The precharging circuit $PR_1$ ($PR_2$) is controlled by a precharging clock signal $\phi_{PR}$. That is the bit lines $BL_1$ and $\overline{BL_1}$ are precharged at $V_{cc}$ after each read or write operation, thus increasing the read or write operation speed.

The memory cell such as $C_{11}$ is provided at each intersection between the word line $WL_1$ and the bit lines $BL_1$ and $\overline{BL_1}$. The memory cell $C_{11}$ is constructed by a flip-flop formed by two cross-coupled inverters and two transfer transistors $Q_{t1}$ and $Q_{t2}$ between nodes $N_1$ and $N_2$ of the flip-flop and the bit lines $BL_1$ and $\overline{BL_1}$. The transfer transistors $Q_{t1}$ and $Q_{t2}$ are controlled by the voltage at the word line $WL_1$. Each of the inverters is formed by a load resistor $R_1$ ($R_2$) and a drive transistor $Q_{d1}$ ($Q_{d2}$) between a power supply line denoted by $V_{cc}$ and a ground line denoted by GND. The node $N_1$ is connected to a gate of the drive transistor $Q_{d2}$, so that the drive transistor $Q^{d2}$ is driven by the voltage at the node $N_1$. Also, the node $N_2$ is connected to a gate of the drive transistor $Q_{d1}$, so that the drive transistor $Q_{d1}$ is driven by the voltage at the node $N_2$.

The dummy memory cell such as $DC_{21}$ has the same configuration as the memory cell $C_{11}$ of the memory cell area 1. However, note that the dummy word line $DWL_2$ is grounded, so that the dummy memory cell $DC_2$ is completely inactive.

The precharging circuit such as $PR_{21}$ is constructed by a transistor $Q_{PR1}$ connected between the power supply line $V_{cc}$ and the bit line $BL_1$ and a transistor $Q_{PR2}$ connected between the power supply line $V_{cc}$ and the bit line $\overline{BL_1}$.

The density of elements in the memory cell area 1 is much higher than that in the precharging circuit areas 3-1 and 3-2. This degrades the operation characteristics of the device. For avoiding the degration of the operation characteristics, the inactive dummy memory cells such as $DC_{11}$ and $DC_{21}$ having the same configuration as the memory cells are inserted between the memory cell area 1 and the precharging circuit areas 3-1 and 3-2.

Figure 3:
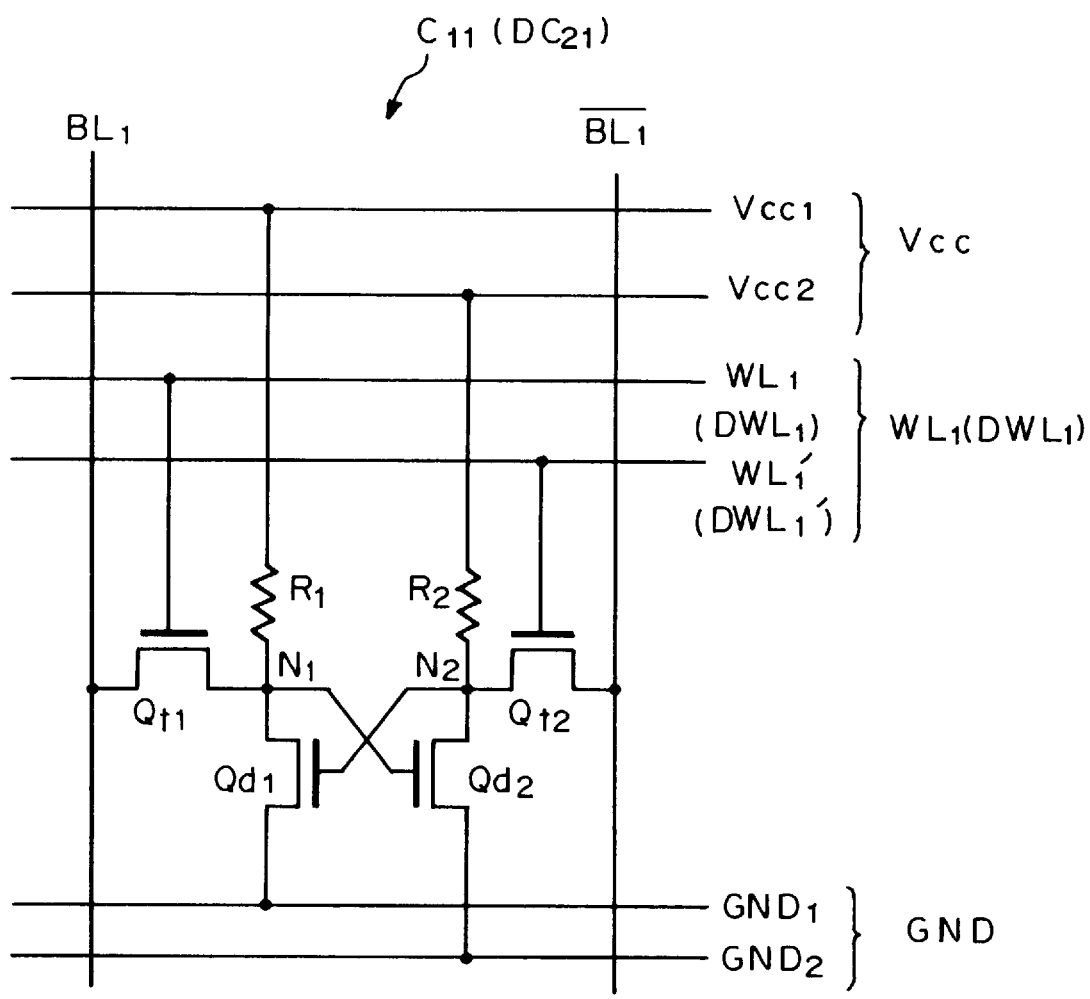
FIG. 3 is an equivalent circuit diagram of the memory cell (the dummy memory cell) of FIG. 2.

The memory cell such as $C_{11}$ and the dummy memory cell such as $DC_{21}$ are actually symmetrical with respect to a center location thereof, so that the memory cells and the dummy memory cells are balanced. As a result, data retention characteristics and soft error resistance characteristics can be improved. For this purpose, the circuit diagram of the memory cell $C_{11}$ (the dummy memory cell $DC_{21}$) is actually as illustrated in FIG. 3, where the power supply line $V_{cc}$ is replaced by two power supply lines $V_{cc1}$ and $V_{cc2}$ whose voltages are the same as each other; the word line $WL_1$ (the dummy word line $DWL_1$) is replaced by two word lines $WL_1$ and $WL_1'$ ($DWL_1$ and $DWL_1'$) whose voltages are the same as each other; and the ground line GND is replaced by two ground lines $GND_1$ and $GND_2$ whose voltages are the same as each other.

An example of the memory cell $C_{11}$ (the dummy memory cell $DC_{21}$) of FIG. 2 is illustrated in FIGS. 4A, 4B, 4C and 4D.

Figure 4A:
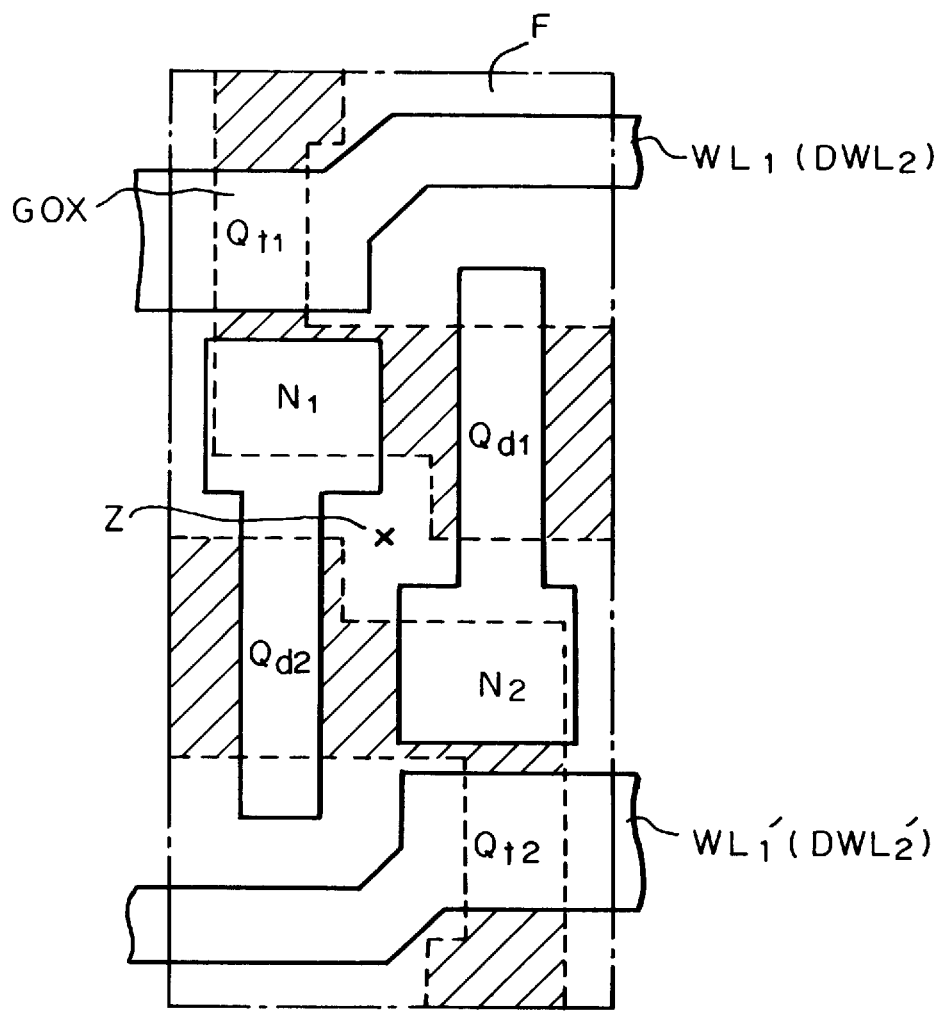
FIGS. 4A, 4B, 4C and 4D are plan views of the memory cell (the dummy memory cell) of FIG. 2.
Figure 4A:
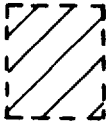

First, referring to FIG. 4A, a P-type monocrystalline silicon substrate (not shown) is thermally oxidized to form a field silicon oxide layer F by using a local oxidation of silicon (LOCOS) process. Thereafter, a gate silicon oxide layer GOX is formed by thermally oxidizing the substrate. Then, gate electrodes of the transistors $Q_{t1}$, $Q_{t2}$, $Q_{d1}$ and $Q_{d2}$ are formed. In this case, the gate electrodes of the transistors $Q_{t1}$ and $Q_{t2}$ also serve as the word lines $WL_1$ and $WL_1'$ (the dummy word lines $DWL_1$ and $WL_1'$), respectively. Then, N-type impurity ions are implanted into the substrate using the gate electrodes as a mask to form N-type impurity diffusion regions as indicated by shaded portions.

In FIG. 4A, the field silicon oxide layer F, the gate electrodes and the N-type impurity diffusion regions are symmetrical with respect to the center location thereof as indicated by Z.

Figure 4B:
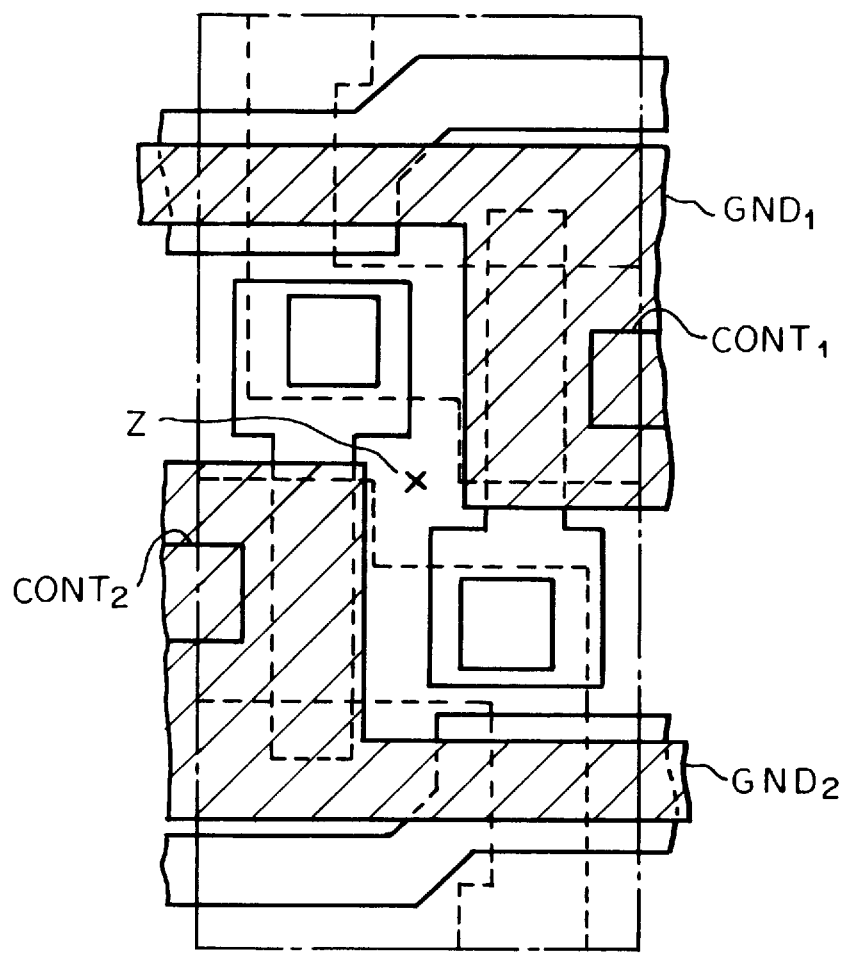

Next, referring to FIG. 4B, a metal (tungsten or the like) layer is formed on an insulating layer (not shown), and is patterned to form the ground lines GND, and $GND_2$. In this case, the ground lines $GND_1$ and $GND_2$ are connected via contact holes $CONT_1$ and $CONT_2$ to sources of the drive transistors $Q_{d1}$ and $Q_{d2}$, respectively.

In FIG. 4B, the ground lines $GND_1$, and $GND_2$ are symmetrical with respect to the center location thereof as indicated by Z.

Figure 4C:
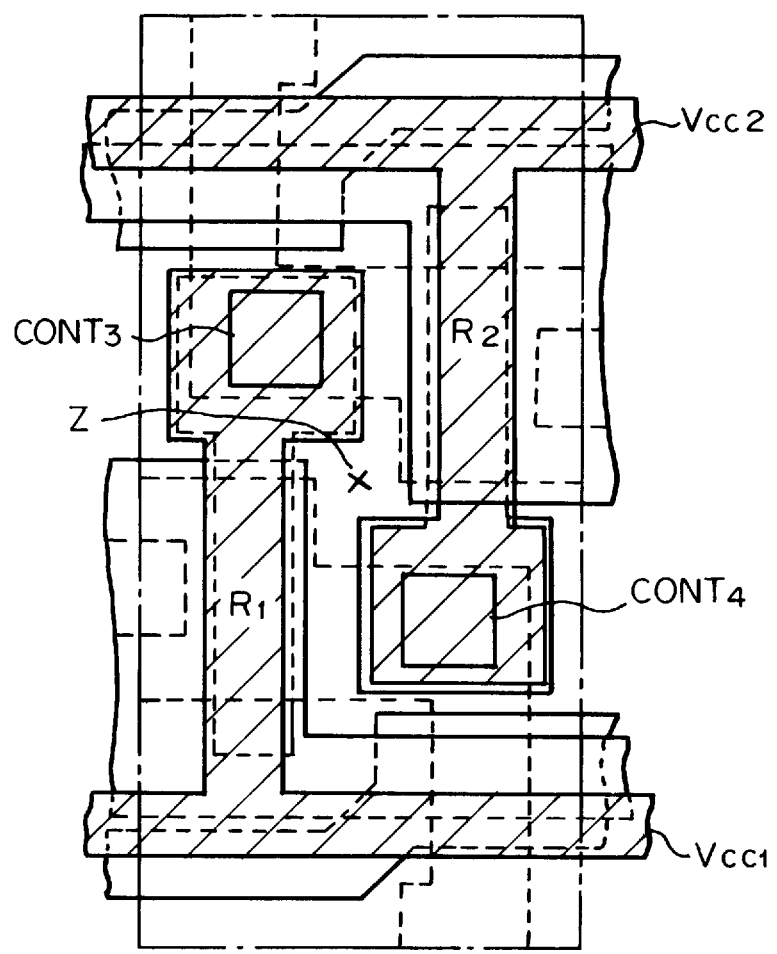

Next, referring to FIG. 4C, a metal (tungsten or the like) layer is formed on an insulating layer (not shown), and a patterned to form the power supply lines $V_{cc1}$, and $V_{cc2}$. In this case, the ground lines $V_{cc1}$ and $V_{cc2}$ are connected via contact holes $CONT_3$ and $CONT_4$ to the nodes $N_1$ and $N_2$, respectively. Also, the load resistors $R_1(R_2)$ are formed between the power supply lines $V_{cc1}$ ($V_{cc2}$) and the contact holes $CONT_3$ ($CONT_4$).

In FIG. 4C, the power supply lines $V_{cc1}$ and $V_{cc2}$ are symmetrical with respect to the center location thereof as indicated by Z.

Figure 4D:
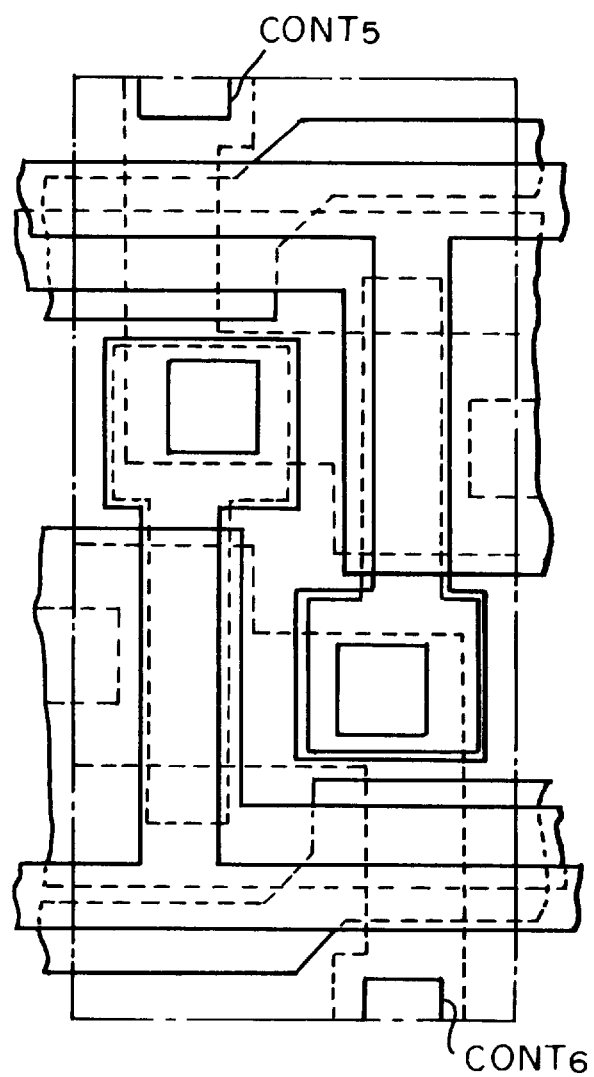

Finally, referring to FIG. 4D, an aluminum layer (not shown) is formed on an insulating layer (not shown) and is patterned to form the bit lines $BL_1$ and $\overline{BL_1}$ (not shown). In this case, the bit lines $BL_1$ and $\overline{BL_1}$ are connected via contact holes $CONT_5$ and $CONT_6$ to the drains of the transfer transistors $Q_{t1}$ and $Q_{t2}$, respectively.

In FIG. 4D, the bit lines $BL_1$ and $\overline{BL_1}$ are symmetrical with respect to the center location thereof as indicated by Z.

In the first prior art SRAM device as illustrated in FIGS. 1, 2, 3, 4A, 4B, 4C and 4D, however, since the length $L_1$ of the precharging circuit area 3-1 (3-2) and the dummy memory cell area 2-1 (2-2) is large, for example, about twenty times the longitudinal length of one memory cell, the integration is reduced.

Figure 5:
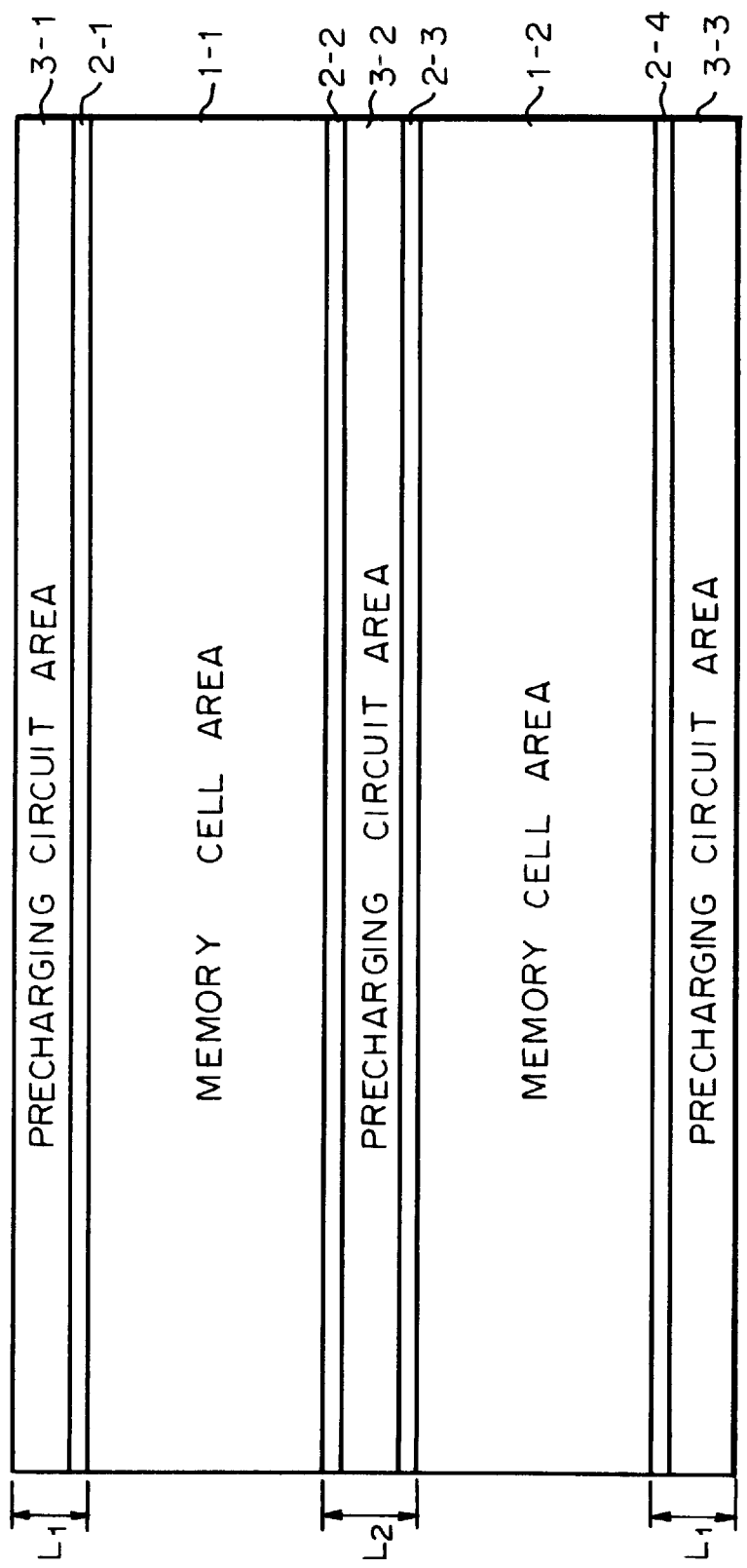
FIG. 5 is a layout diagram illustrating a second prior art SRAM device.
Figure 6:
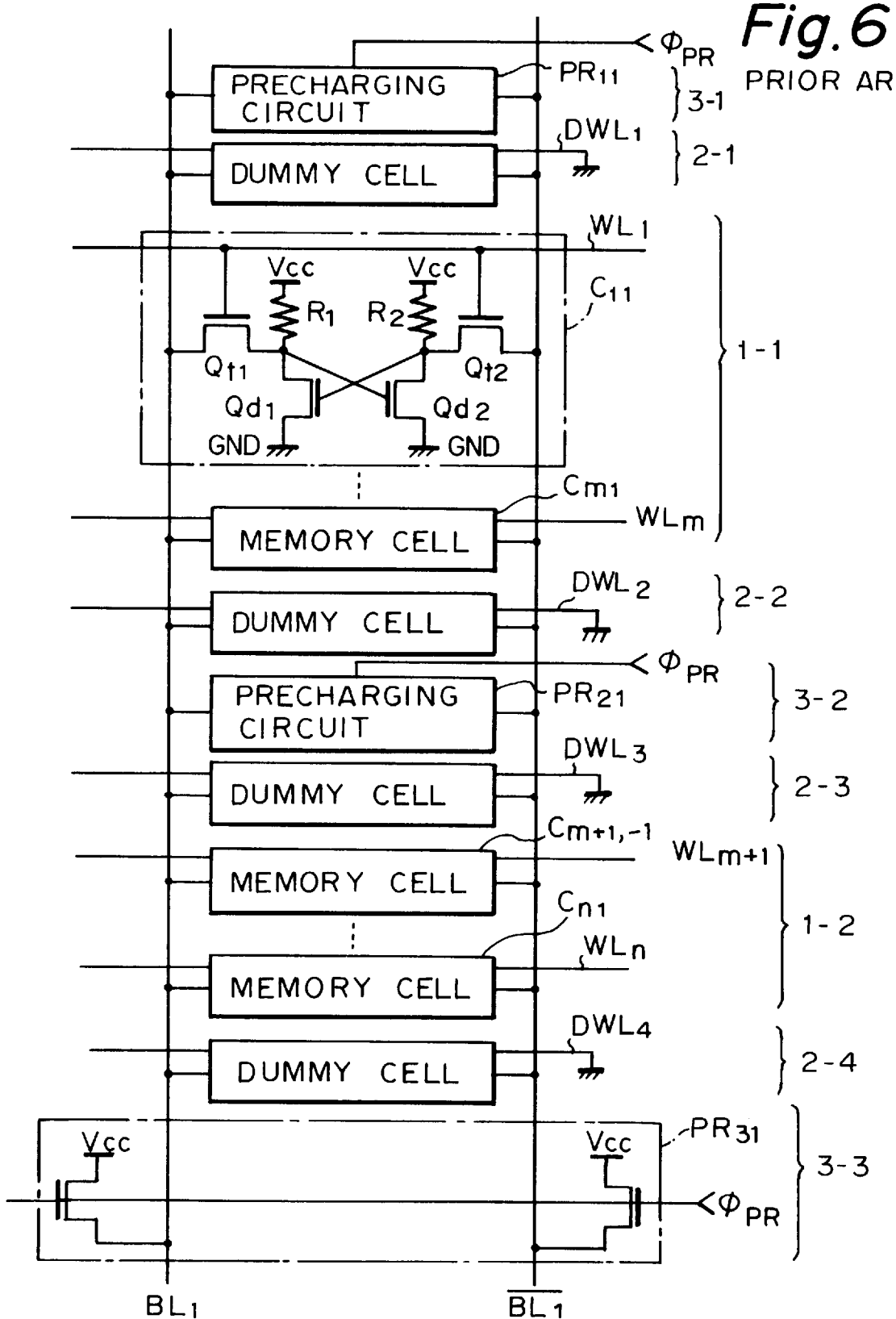
FIG. 6 is a circuit diagram of one column of the device of FIG. 5.

FIG. 5 is a layout diagram illustrating a second prior art SRAM device, and FIG. 6 is a circuit diagram of one column of the device of FIG. 5. In FIGS. 5 and 6, in order to homogenize precharging currents in the device of FIG. 1, three precharging circuit areas 3-1, 3-2 and 3-3 are provided. In this case, the memory cell area 1 of FIG. 1 is divided into two memory cell areas 1-1 and 1-2. Therefore, dummy memory cell areas 2-1, 2-2, 2-3 and 2-4 are required between the memory cell areas 1-1 and 1-2 and the precharging circuit areas 3-1, 3-2, 3-3 and 3-4.

In the second prior art SRAM device as illustrated in FIGS. 5 and 6, however, the length $L_1$ of the precharging circuit area 3-1 (3-3) and the dummy memory cell are 2-1 (2-4) is large, for example, about twenty times the longitudinal length of one memory cell, and also, the length $L_2$ of the precharging circuit 3-2 and the dummy memory areas 2-2 and 2-3 is larger than the length $L_1$. Therefore, since $2L_1$ $L_2 > 2L_1$ (first prior art), the integration is further reduced.

Figure 7:
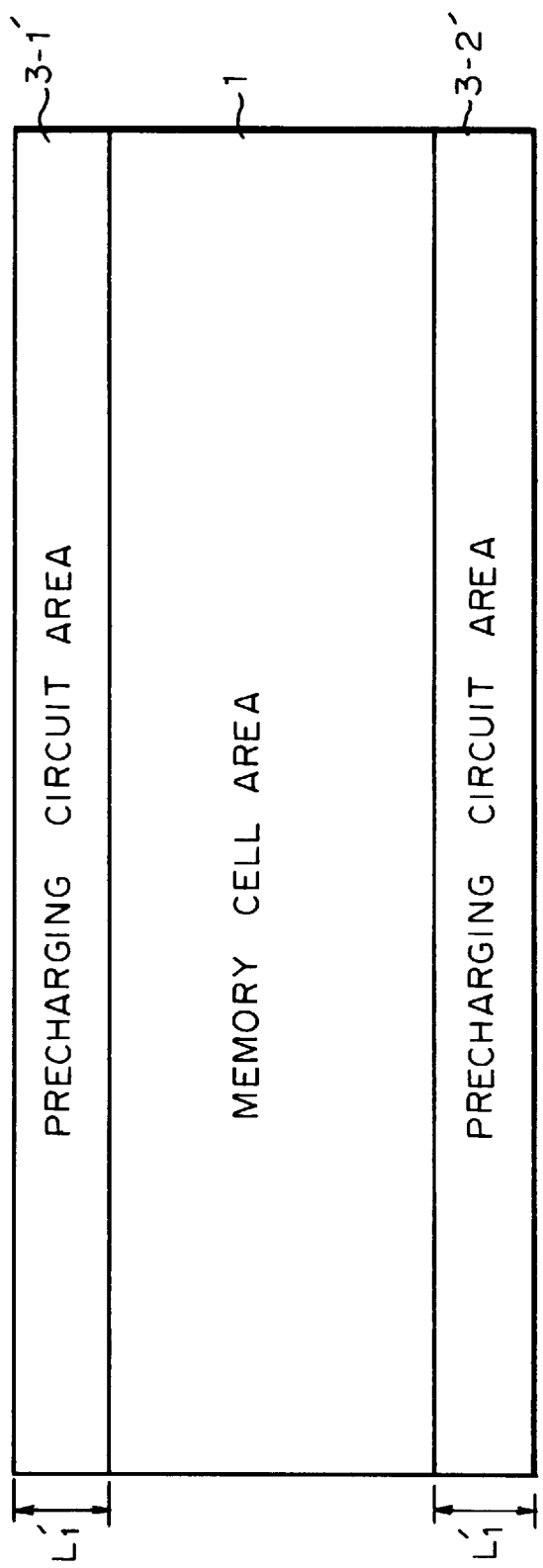
FIG. 7 is a layout diagram illustrating a first embodiment of the SRAM device according to the present invention.

In FIG. 7, which is a layout diagram illustrating a first embodiment of the SRAM device according to the present invention, the dummy memory cell areas 2-1 and 2-2 of FIG. 1 are deleted, and the precharging circuit areas 3-1 and 3-2 are modified to precharging circuit areas 3-1' and 3-2', respectively.

Figure 8:
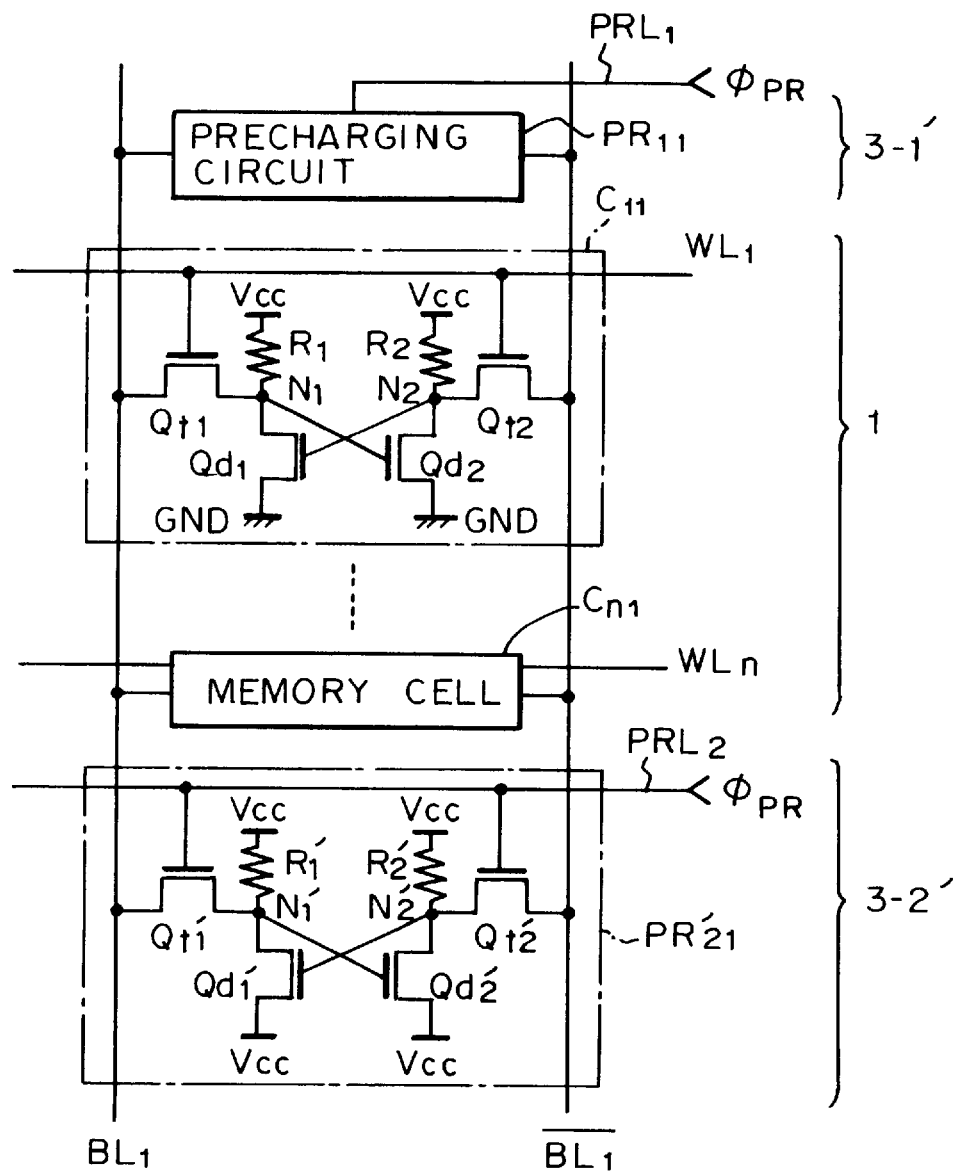
FIG. 8 is a circuit diagram of one column of the device of FIG. 7.

In FIG. 8, which is a circuit diagram of one column of the device of FIG. 7, the precharging circuit area 3-1 ' (3-2') includes one precharging circuit $PR_{11}'$ ($PR_{21}'$) connected to the bit lines $BL_1$ and $\overline{BL_1}$. The precharging circuit $PR_1'$ ($PR_2'$) is connected to a precharging line $PRL_1$ ($PRL_2$) which controlled by a precharging clock signal $\phi_{PR}$. The precharging line $PRL_1$ ($PRL_2$) corresponds to the word line such as $WL_1$.

The precharging circuit such as $PR_2'$ has a similar configuration to the memory cell $C_{11}$. That is, the precharging circuit such as $PR_2'$ is provided at each intersection between the word line $WL_1$ and the bit lines $BL_1$ and $\overline{BL_1}$. The precharging circuits $PR_2'$ is constructed by a cross-coupled balancer and two transfer transistors $Q_{t1}'$ and $Q_{t2}'$ between nodes $N_1'$ and $N_2'$ of the balancer and the bit lines $BL_1$ and $\overline{BL_1}$. The transfer transistors $Q_{t1}'$ and $Q_{t2}'$ are controlled by the voltage at the precharging line $PR_2$. Each element of the balancer is formed by a load resistor $R_1'$ ($R_2'$) and a drive transistor $Q_{d1}'$ ($Q_{d2}'$) connected to the power supply line $V_{cc}$. The node $N_1'$ is connected to a gate of the drive transistor $Q_{d2}'$, so that the drive transistor $Q^{d2'}$ is driven by the voltage at the node $N_1'$. Also, the node $N_2'$ is connected to a gate of the drive transistor $Q_{d1}'$, so that the drive transistor $Q_{d1}'$ is driven by the voltage at the node $N_2'$.

Thus, since the precharging circuit $PR_1'$ ($PR_2'$) has a similar configuration to the memory cell such as $C_{11}$, the precharging circuit $PR_1'$ ($PR_2'$) can also serve as the dummy memory cell $DC_{11}$ ($DC_{21}$) of FIG. 2.

Figure 9:
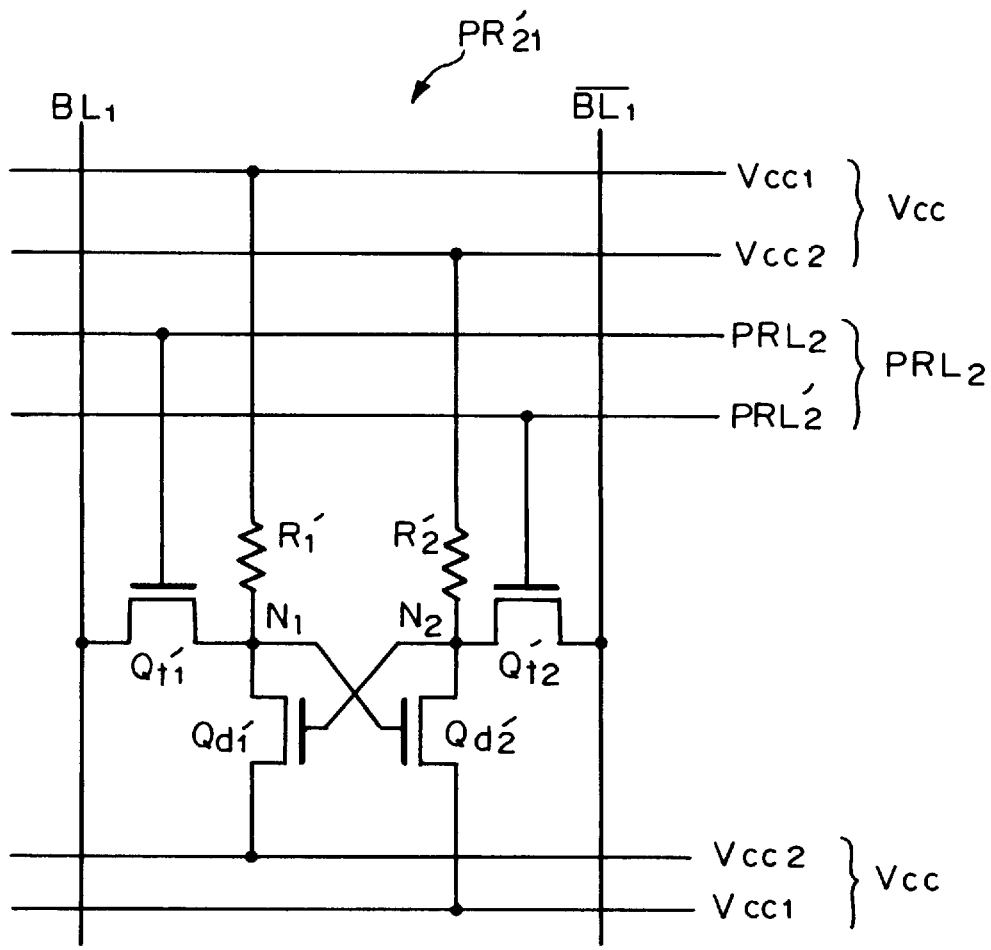
FIG. 9 is an equivalent circuit diagram of the precharging circuit of FIG. 8.

The precharging circuit such as, $PR_2'$ is actually symmetrical with respect to a center location thereof, so that the precharging circuit $PR_2'$ is balanced. For this purpose, the circuit diagram of the precharging circuit $PR_2'$ is actually as illustrated in FIG. 9, where the power supply line $V_{cc}$ is replaced by two power supply lines $V_{cc1}$ and $V_{cc2}$ whose voltages are the same as each other; the precharging line $PRL_2$ is replaced by two word lines $PRL_2$ and $PRL_2'$ whose voltages are the same as each other; and the ground line GND is replaced by two ground lines $GND_1$ and $GND_2$ whose voltages are the same as each other.

An example of the precharging circuit $PR_2'$ is illustrated in FIGS. 10A, 10B, 10C and 10D.

Figure 10A:
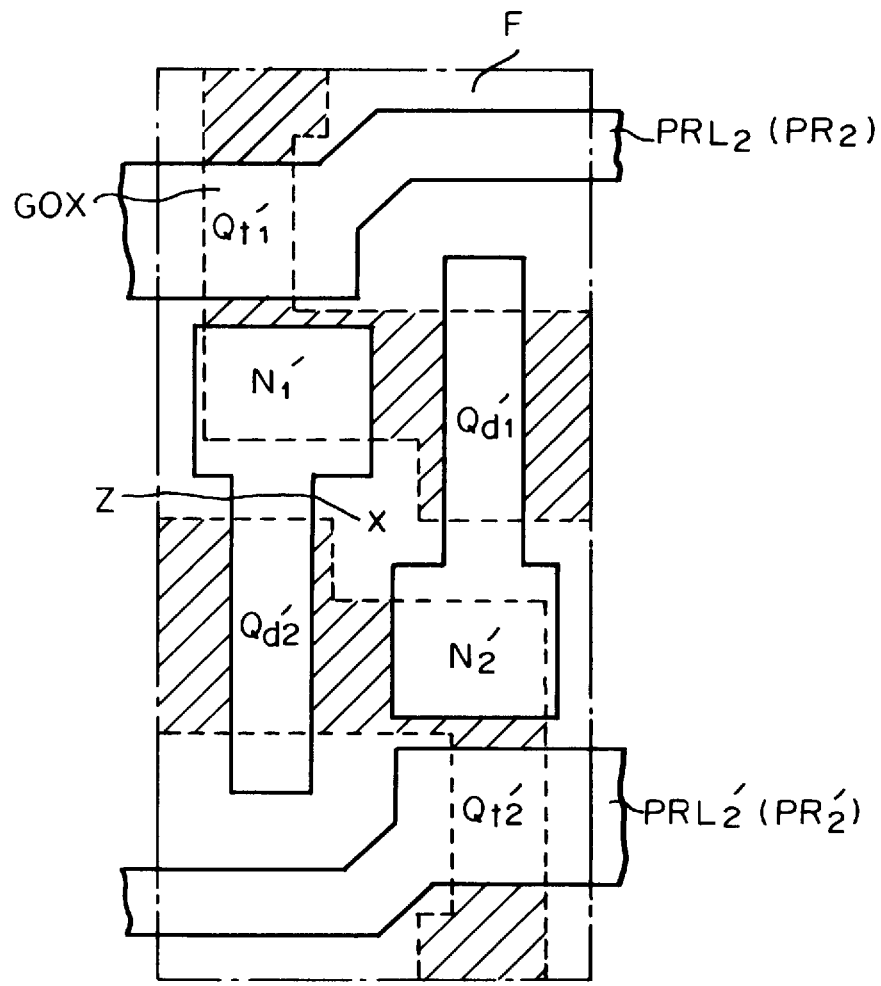
FIGS. 10A, 10B and 10C are plan views of the precharging circuit of FIG. 8.
Figure 10A:
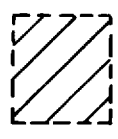

First, referring to FIG. 10A, a P-type monocrystalline silicon substrate (not shown) is thermally oxidized to form a field silicon oxide layer F by using a LOCOS process. Thereafter, a gate silicon oxide layer GOX is formed by thermally oxidizing the substrate. Then, gate electrodes of the transistors $Q_{t1}'$, $Q_{t2}'$, $Q_{d1}'$ and $Q_{d2}'$ are formed. In this case, the gate electrodes of the transistors $Q_{t1}'$ and $Q_{t2}'$ also serve as the precharging lines $PRL_2'$ and $PRL_2'$, respectively. Then, N-type impurity ions are implanted into the substrate using the gate electrodes as a mask to form N-type impurity diffusion regions as indicated by shaded portions.

In FIG. 10A, the field silicon oxide layer F, the gate electrodes and the N-type impurity diffusion regions are also symmetrical with respect to the center location thereof as indicated by Z.

Figure 10B:
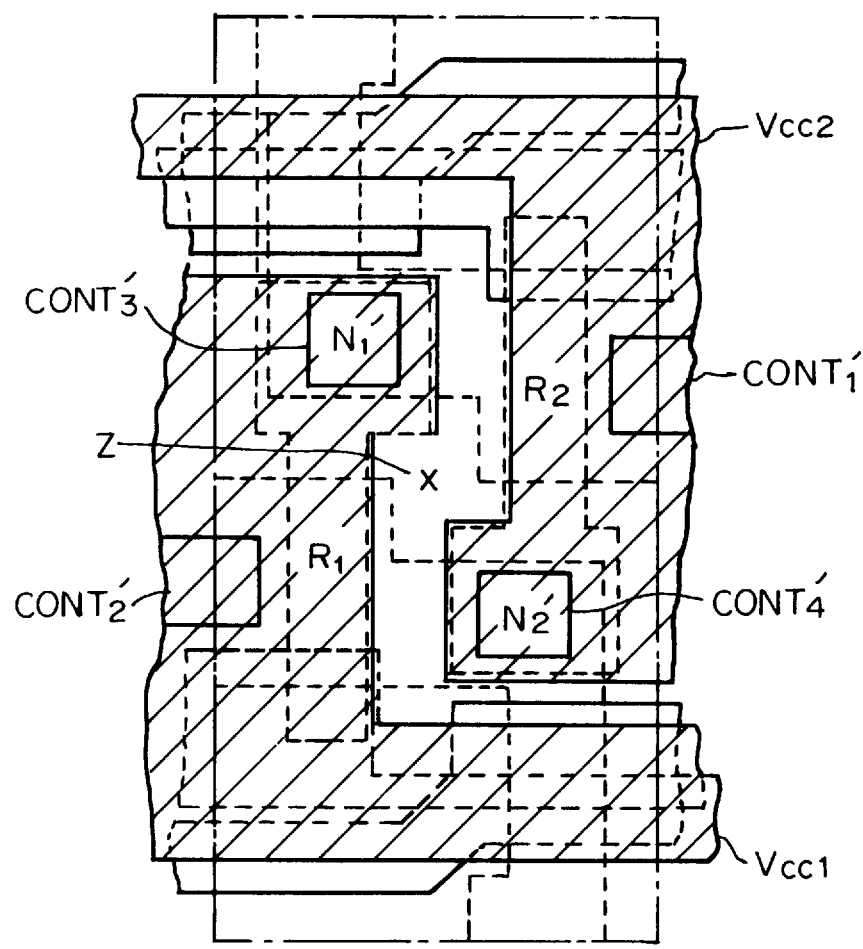
Figure 10:
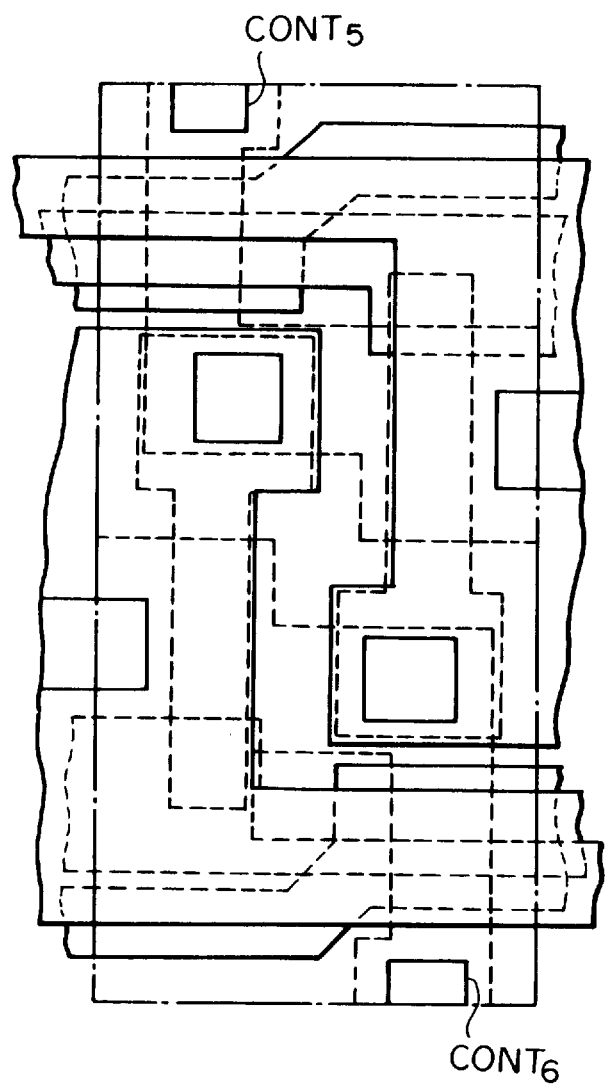

Next, referring to FIG. 10B, a metal (tungsten or the like) layer is formed on an insulating layer (not shown), and is patterned to form the power supply lines $V_{cc1}$, and $V_{cc2}$. In this case, the power supply line $V_{cc1}$ is connected via contact holes $CONT_2'$ and $CONT_3'$ to a source of the drive transistor $Q_{d2}'$ and the node $N_1'$ Also, the power supply line $V_{cc2}$ is connected via contact holes $CONT_1'$ and $CONT_4'$ to a source of the drive transistor $Q_{d1}'$ and the node $N_2'$. Further, the load resistors $R_1$ ($R_2$) are formed between the power supply lines $V_{cc1}$ ($V_{cc2}$) and the contact holes $CONT_3'$ ($CONT_4'$).

In FIG. 10B, the power supply lines $V_{cc1}$ and $V_{cc2}$ are also symmetrical with respect to the center location thereof as indicated by Z.

Finally, referring to FIG. 10C, an aluminum layer (not shown) is formed on an insulating layer (not shown) and is patterned to form the bit lines $BL_1$ and $\overline{BL_1}$(not shown). In this case, the bit lines $BL_1$ and $\overline{BL_1}$ are connected via contact holes $CONT_5$ and $CONT_6$ to the drains of the transfer transistors $Q_{t1}'$ and $Q_{t2}'$ respectively.

In FIG. 4C, the bit lines $BL_1$ and $BL_1$ are also symmetrical with respect the center location thereof as indicated by Z.

The precharging circuit $PR_2'$ as illustrated in FIGS. 10A, 10B and 10C can be manufactured simultaneously with the memory cell $C_{11}$ as illustrated in FIGS. 4A, 4B, 4C and 4D. In this case, ions are implanted into the power supply lines $V_{cc1}$ and $V_{cc2}$ only within the precharging circuit areas 3-1' and 3-2', to reduce the resistance values of the load resistors $R_1'$ and $R_2'$, thus increasing the current supply ability of the precharging circuits to the bit lines such as $BL_1$ and $\overline{BL_1}$. Also, the amount of ions implanted into channel portions of the transistors $Q_{t1}'$, $Q_{t2}'$, $Q_{d1}'$ and $Q_{d2}'$ of the precharging circuits is reduced as compared with the amount of ions implanted into channel portions of the transistors $Q_{t1}$, $Q_{t2}$, $Q_{d1}$ and $Q_{d2}$ of the memory cells. As a result, the threshold voltages of the transistors $Q_{t1}'$, $Q_{t2}'$, $Q_{d2}'$ and $Q_{d1}'$ of the precharging circuits are reduced as compared with those of the transistors $Q_{t1}$, $Q_{t2}$, $Q_{d1}$ and $Q_{d2}$ of the memory cells. This also, increases the current supply ability of the precharging circuits to the bit lines such as $BL_1$ and $\overline{BL_1}$.

In the first embodiment as illustrated in FIGS. 7, 8, 9, 10A, 10B and 10C, since the length $L_1'$ of the precharging circuit area 3-1' (3-2') is small, for example, about ten times as the longitudinal length of one memory cell, the integration can be enhanced.

The cross-coupled balancer circuit configuration of the precharging circuit such as $PR_{21}$ enhances the charging speed of the bit lines $BL_1$ and $\overline{BL_1}$. For example, 3assume that the voltages at the bit lines $BL_1$ and $\overline{BL_1}$ are given by $V_{cc}-\alpha$ and $V_{cc}-\beta$, respectively. If $(V_{cc}-\alpha)-(V_{cc}-\beta)=\beta-\alpha>V_{th}$ where $V_{th}$ is a threshold voltage of the transistors $Q_{d1}'$ and $Q_{d2}'$, the transistor $Q_{d2}'$ is turned ON, so that the bit line $\overline{BL_1}$ is charged by $V_{cc}$. On the other hand, if $(V_{cc}-\beta)-(V_{cc}-\alpha)=\alpha-\beta>V_{th}$, the transistor $Q_{d1}'$ is turned ON, so that the bit line $BL_1$ is charged by $V_{cc}$. Thus, transistors $Q_{d1}'$ and $Q_{d2}'$ are alternately turned ON, so that the voltages at the bit lines $BL_1$ and $\overline{BL_1}$ are equalized.

Figure 11:
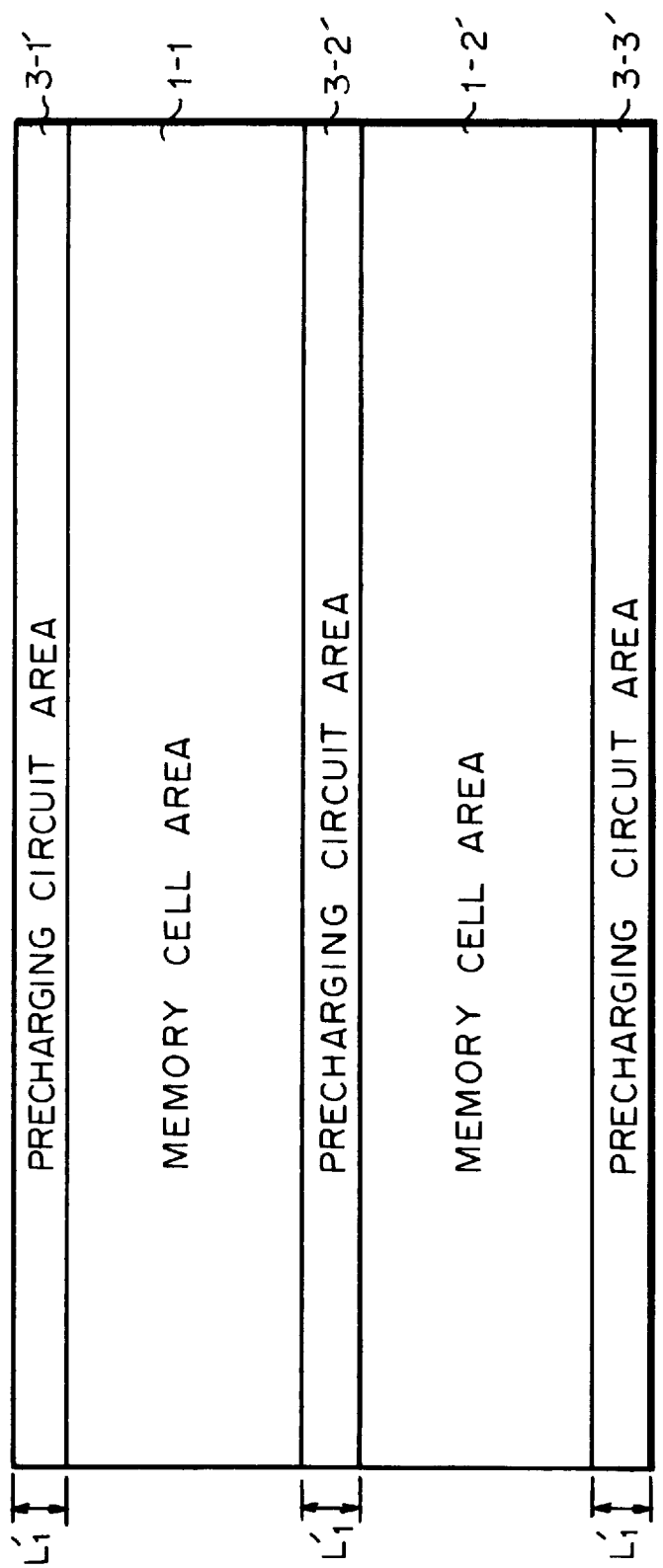
FIG. 11 is a layout diagram illustrating a second embodiment of the SRAM device according to the present invention.
Figure 12:
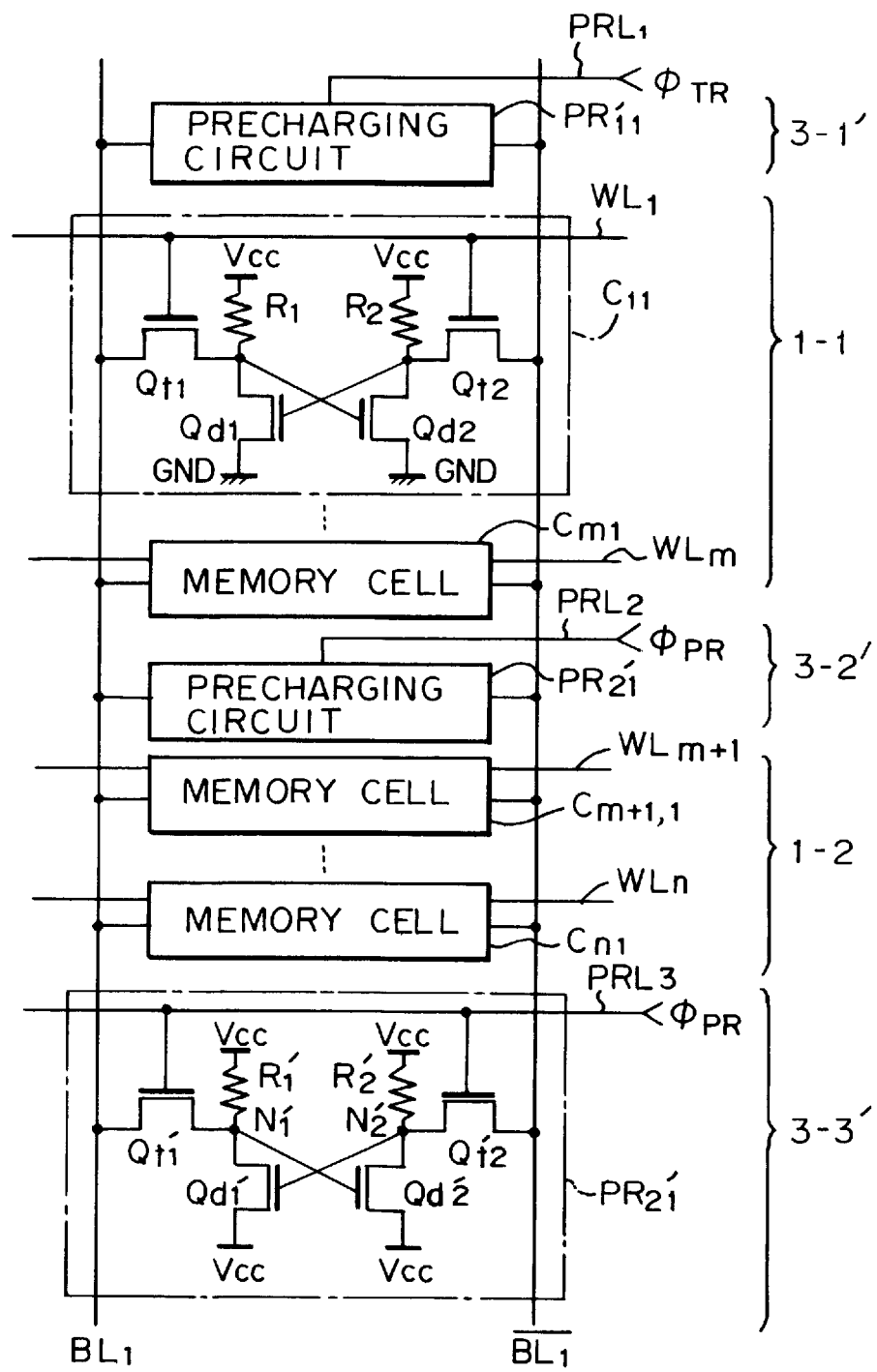
FIG. 12 is a circuit diagram of one column of the device of FIG. 11.

FIG. 11 is a layout diagram illustrating a second embodiment of the SRAM device according to the present invention, and FIG. 12 is a circuit diagram of one column of the device of FIG. 11. In FIGS. 11 and 12, in order to homogenize precharging currents in the device of FIG. 7, three precharging circuit areas 3-1', 3-2' and 3-3' are provided. In this case, the memory cell area 1 of FIG. 7 is divided into two memory cell areas 1-1 and 1-2. Also, the dummy memory cell areas 2-1, 2-2, 2-3 and 2-4 of FIGS. 5 and 6 are deleted. Since the precharging circuit areas 3-1', 3-2' and 3-3' serve as dummy memory cell areas.

In the SRAM device as illustrated in FIGS. 11 and 12, the length $L_1'$ of the precharging circuit area 3-1' (3-2', 3-3') is small, for example, about ten times as the longitudinal length of one memory cell. Therefore, since $3L_1'<2L_1+L_2$ (second prior art), the integration is enhanced.

In the present invention, note that it is possible to introduce only one precharging circuit area as illustrated in FIGS. 7 and 11 into an SRAM device. Also, it is possible to introduce four or more precharging circuit areas as illustrated in FIGS. 7 and 11 into an SRAM device.

As explained hereinabove, according to the present invention, since precharging circuits also serve as dummy memory cells, the dummy memory cells can be omitted, thus enhancing the integration.

I claim:

1. A static semiconductor memory device comprising:

a plurality of word lines;

a plurality of bit line pairs;

at least one precharging line;

a plurality of static memory cells connected to one of said word lines and one of said bit line pairs; and a plurality of precharging circuits, connected to said precharging line and one of said bit line pairs, for charging said one of said bit line pairs, each of said precharging circuits having a similar configuration to one of said static memory cells.

2. The device as set forth in claim 1, further comprising first and second power supply lines, each of said static memory cells comprising:

first and second nodes;

a first transfer transistor connected between a first bit line of one of said bit line pairs and said first node, said first transfer transistor being controlled by a voltage at one of said word lines;

a second transfer transistor connected between a second bit line of said one of said bit line pairs and said second node, said second transfer transistor being controlled by the voltage at said one of said word lines;

a first load resistor connected between said first power supply line and said first node;

a second load resistor connected between said first power supply line and said second node;

a first drive transistor connected between said first node and said second power supply line; and a second drive transistor connected between said second node and said second power supply line, each of said precharging circuits comprising:
   third and fourth nodes;
   a third transfer transistor connected between said first bit line and said third node, said third transfer transistor being controlled by a voltage at said precharging line;
   a fourth transfer transistor connected between said second bit line and said fourth node, said fourth transfer transistor being controlled by the voltage at said precharging line;
   a third load resistor connected between said first power supply line and said third node;
   a fourth load resistor connected between said first power supply line and said fourth node;
   a third drive transistor connected between said third node and said first power supply line; and
   a fourth drive transistor connected between said fourth node and said first power supply line.

3. The device as set forth in claim 2, wherein each of said static memory cells is symmetrical with respect to center location thereof, each of said precharging circuits being symmetrical with respect to a center location thereof.

4. The device as set forth in claim 1, wherein each of said precharging circuits is arranged adjacent to and in the vicinity of a memory cell array comprising said static memory cells.

5. The device as set forth in claim 1, wherein said static memory cells are grouped into a plurality of memory cell arrays,
   said precharging circuits being arranged between gaps separating said memory cell array.

* * * * *